United States Patent [19]

Brors et al.

[11] Patent Number: 4,796,562
[45] Date of Patent: Jan. 10, 1989

[54] RAPID THERMAL CVD APPARATUS

[75] Inventors: Daniel L. Brors, Fremont; Larry R. Lane, San Jose; Mark W. Goldsborough, Santa Clara; Jason M. Samsel, Milpitas; Max van Mastrigt, San Jose; Robert Foster, San Francisco, all of Calif.

[73] Assignee: Varian Associates, Inc., Palo Alto, Calif.

[21] Appl. No.: 3,516

[22] Filed: Jan. 15, 1987

Related U.S. Application Data

[63] Continuation-in-part of Ser. No. 805,029, Dec. 3, 1985, Pat. No. 4,709,655.

[51] Int. Cl.[4] .................... C23C 16/48; F27D 11/00
[52] U.S. Cl. .................................. 118/725; 118/50.1; 118/728; 219/405; 219/411
[58] Field of Search ............... 118/725, 728, 50.1, 118/715; 219/405, 411

[56] References Cited

U.S. PATENT DOCUMENTS

| | | | |
|---|---|---|---|
| 2,685,124 | 8/1954 | Toulmin, Jr. | 29/191 |
| 3,098,763 | 7/1963 | Deal et al. | 118/724 |
| 3,384,049 | 5/1968 | Capita | 118/725 |
| 3,460,510 | 8/1969 | Currin | 118/720 |
| 3,477,872 | 11/1969 | Amick | 437/187 |
| 3,540,920 | 11/1970 | Wakefield | 428/641 |
| 3,565,676 | 2/1971 | Holzl | 427/253 |
| 3,594,227 | 7/1971 | Oswald | 437/172 |
| 3,645,230 | 2/1972 | Hugle et al. | 118/730 |
| 3,669,724 | 6/1972 | Brand | 437/243 |
| 3,673,983 | 7/1972 | Strater et al. | 118/724 |
| 3,697,343 | 10/1972 | Cuomo et al. | 156/646 |
| 3,862,397 | 1/1975 | Anderson et al. | 219/405 |
| 3,865,072 | 2/1975 | Kirkman | 118/663 |
| 4,047,496 | 9/1977 | Mcneilly et al. | 427/255 X |
| 4,065,369 | 12/1977 | Ogawa et al. | 204/164 |
| 4,089,992 | 5/1978 | Doo et al. | 437/241 |
| 4,096,297 | 6/1978 | Pappis et al. | 427/294 X |
| 4,123,571 | 10/1978 | Balog et al. | 427/249 |
| 4,180,596 | 12/1979 | Crowder et al. | 427/42 |
| 4,247,579 | 1/1981 | Tuft | 156/643 X |
| 4,258,658 | 3/1981 | Politycki et al. | 118/719 |
| 4,276,557 | 6/1981 | Levinstein et al. | 357/67 |
| 4,310,380 | 1/1982 | Flamm et al. | 156/643 |
| 4,332,839 | 6/1982 | Levinstein et al. | 156/643 X |
| 4,343,676 | 8/1982 | Tarng | 156/628 |
| 4,359,490 | 11/1982 | Lehrer | 427/255.2 X |
| 4,391,846 | 7/1983 | Raymond | 427/255 X |
| 4,392,299 | 7/1983 | Shaw | 29/590 |
| 4,411,734 | 10/1983 | Maa | 156/643 |
| 4,446,817 | 5/1984 | Crawley | 118/725 |
| 4,458,410 | 7/1984 | Suzaki | 29/591 |
| 4,461,020 | 7/1984 | Hübner et al. | 378/143 |
| 4,470,189 | 9/1984 | Roberts et al. | 29/571 |
| 4,501,769 | 2/1985 | Hieber et al. | 427/255.2 X |
| 4,504,521 | 3/1985 | Widner et al. | 427/255.2 X |
| 4,510,670 | 4/1985 | Schwabe et al. | 29/571 |
| 4,532,702 | 8/1985 | Gigante et al. | 29/578 |
| 4,540,607 | 9/1985 | Tsao | 427/253 |
| 4,557,943 | 12/1985 | Rosler et al. | 427/38 |
| 4,565,157 | 1/1986 | Brors et al. | 118/719 |
| 4,592,308 | 6/1986 | Shih et al. | 118/728 X |
| 4,607,591 | 8/1986 | Stitz | 118/666 |
| 4,629,635 | 12/1986 | Brors | 427/255.2 |

*Primary Examiner*—Evan Lawrence
*Attorney, Agent, or Firm*—Stanley Z. Cole; Gerald M. Fisher; Kenneth L. Warsh

[57] ABSTRACT

In a chemical vapor deposition apparatus for coating semiconductor wafers, the wafer is held face down in the reaction chamber. A radiant heat source above the wafer and outside the reaction chamber. The wafer is held on a ring chuck by means of a retractable clamp heats the wafer from its backside to a temperature in excess of 1000° C. rapidly. The radiant heat source includes cylindrical lamps placed in a radial pattern to improve heating uniformity. In the selective tungsten process the temperature of the wafer is raised from ambient to about 600° C. while flowing process gases. At the upper temperature range the heating source can be rapidly cycled on and off to improve the uniformity of coating.

25 Claims, 9 Drawing Sheets

RAPID THERMAL CVD APPARATUS

This application is a continuation-in-part of application Ser. No. 805,029 filed Dec. 3, 1985, now U.S. Pat. No. 4,709,655.

FIELD OF THE INVENTION

This invention pertains to an apparatus for chemical vapor deposition (CVD) on semiconductor wafers, and in particular to an apparatus suitable for depositing selective tungsten.

BACKGROUND OF THE INVENTION

Chemical Vapor Deposition (CVD) is the process of depositing a solid material from a gaseous phase onto a substrate by means of a chemical reaction. The deposition reaction involved is generally thermal decomposition, chemical oxidation, or chemical reduction. In one example of thermal decomposition, organometallic compounds are transported to the substrate surface as a vapor and are reduced to the elemental metal state on the substrate surface.

For chemical reduction, the reducing agent most usually employed is hydrogen, although metal vapors can also be used. The substrate can also act as a reductant as in the case of tungsten hexafluoride reduction by silicon. The substrate can also supply one element of a compound or alloy deposit. The CVD process can be used to deposit many elements and alloys as well as compounds including oxides, nitrides and carbides.

Since their invention integrated circuits [ICs] have been fabricated from silicon, oxygen and aluminum in elemental or compound form. More recently, a new class of refractory materials is being added to basic elements that have been sufficient for so long in response to changing materials requirements dictated by smaller IC feature size, higher current densities and the desire for better electrical performance. Design requirements have narrowed the choice of materials to those which exhibit low contact resistance to silicon, high resistance to the effects of electromigration at contacts or steps, and to materials which can be deposited at temperatures low enough to preserve ever shallower junctions.

Refractory metals can be deposited in various forms as refractory metal silicides, as blankets of refractory metals, or selectively on other metal surfaces without deposition on adjacent dielectric such as silicon dioxide or silicon nitrate. The selective deposition saves masking in etch steps and provides self-aligning structures.

Tungsten and other refractory metals are being seriously considered for use in advanced ICs. CVD selective tungsten has been shown to meet a variety of requirements on VLSI and ULSI chips such as a diffusion barrier, etch barrier, via fill, low resistance shunt of source/drain regions and on gates in pure or silicide form. Tungsten is also being applied as an IC fabrication aid, such as self-aligning scratch-resistance pads for in-process testing, stencils for etch selectivity enhancement and masks for x-ray lithography, low reflectivity coatings, etc, and even for novel passive micro devices such as squids, bridge wires, etc.

In addition to its favorable physical properties, tungsten is of particular interest because it can be deposited selectively on silicon, metals, or silicides, so that it is truly self-aligning. Tungsten can also serve a volume filling function, thus enhancing planarity, a high priority in multi-level chip designs. Because it can be deposited without additional masks, process complexity is reduced with a concommitment cost-saving. Increasing use of in-process testing is expected to enhance yields. As IC technology is driven to small feature size and multiple interconnect levels, the selective deposition capability of a CVD process will become ever more important.

CVD of refractory metals offer some advantages over sputtering. CVD refractory metals can provide good step coverage, reduce system complexity, and yield higher purity deposits. To take advantage of these benefits a CVD process with high throughput is required. Early CVD refractory metal work for VLSI was done in cold-wall reactors operating at atmospheric pressures with small batch sizes. Reduced pressure, cold-wall, CVD technology offers the possibility of producing refractory films for VLSI in large quantities.

In the present invention, CVD technology can be used to manufacture deposits on substrates for a variety of purposes. Tungsten carbide and aluminum oxide wear coatings on cutting tools; corrosion resistant coatings of tantalum, boron nitride, silicon carbide and the like and tungsten coatings on steel to reduce erosion can be applied according to this invention. The apparatus and method is particularly advantageous in manufacturing solid state electronic devices and energy conversion devices.

Chemical vapor deposition of electronic materials is described by T. L. Chu et al, J. Bac. Sci. Technol. 10, 1 (1973) and B. E. Watts, Thin Solid Films 18, 1 (1973). They describe the formation and doping of epitaxial films of such materials as silicon, germanium and GaAs, for example. In the field of energy conversion, the CVD process provides materials for nuclear fission product retention, solar energy collection, and superconduction. A summary of the chemical vapor deposition field is provided by W. A. Bryant, "The Fundamentals of Chemical Vapour Deposition" in Journal of Materials Science 12, 1285 (1977).

The deposition parameters of temperature, pressure, the ratio of reactant gases, and amount and distriution of gas flow critically determine the deposition rates and the ability of a particular system to provide the desired uniformity and quality of deposition. The limitations of prior art systems stem from their inability to adequately control one or more of these factors from deposit contamination.

The reaction chambers employed for chemical vapor deposition are generally classified as cold-wall or as hot-wall systems. In cold-wall systems, the substrate is heated by inductive coupling, radiant heating or direct electrical resistance heating of internal support elements. Hot-wall systems rely on radiant heating elements arranged to create a heated reaction and deposition zone. Conduction and convection heating approaches have also been used in hot-wall system.

Cold-wall systems for chemical vapor deposition are described in U.S. Pat. Nos. 3,594,227, 3,699,298 and 3,916,822. In these systems, the semiconductor wafers are positioned inside a vacuum chamber, and induction coils are arranged exterior to the vacuum chamber. The wafers are mounted on a susceptible material adapted for heating by RF energy. By localizing heat to the immediate semiconductor wafer area, chemical vapor deposition is limited to the heated areas. Since the unheated walls are below CVD temperatures, deposition on the walls is reduced. The temperatures in the reaction zone are usually not as uniform as those obtained with hot-wall systems, and it is impossible to control the temperature across individual wafers.

OBJECTS OF THE INVENTION

An object of the invention is to provide an apparatus for rapidly and uniformly heating and cooling a semiconductor wafer or other substrate in a chemical vapor deposition apparatus.

SUMMARY OF THE INVENTION

These objects of the invention and other objects, features and advantages to become apparent as the specification progresses are accomplished by the invention according to which, briefly stated, a rapid thermal chuck has been devised to rapidly heat wafers to high temperatures in a CVD system. The chuck is comprised of a heat source of halogen lamps, a water-cooled chuck holder, and a quartz ring chuck. The invention allows for heating the wafer to over 1000° C. in 10 seconds or less.

Gases are injected into the chamber and films are deposited on the wafer face which is clamped face down to the quartz ring chuck. There is minimal deposition on the quartz ring chuck since it is in contact with the water-cooled chuck holder. The inner surface of the chuck holder is polished so the maximum amount of radiant energy is transferred to the wafer. Such an arrangement has been found to be necessary for the deposition of selective tungsten which requires for best results rapid temperature changes of the wafer during processing. The invention also allows for sequential depositions of various materials at various different temperatures.

A novel process for the deposition of selective tungsten can be practiced with the rapid thermal chuck apparatus of the invention described heretofore. In this process the deposition of tungsten is begun while raising the temperature of the wafer from about 300° C. to about 600° C. in about half a minute. The initial deposition of tungsten on the silicon contacts is done at the lower temperature to reduce encroachment (consumption of the silicon wafer). As the temperature rises, the initial part of the tungsten layer prevents the encroachment from being a serious problem any longer. The higher the temperature of the wafer, the more rapid the deposition rate and the more selective the tungsten deposition. Thus, by ramping the temperature upward while depositing tungsten, rapid selective tungsten deposition can be achieved while minimizing problems of encroachment.

The radiant heating apparatus according to the invention is designed to achieve uniform heating of the wafer. Lack of perfect uniformity of heating can be corrected by a novel method of operation of the apparatus. According to the method of the invention, as the temperature of the wafer approaches the highest temperature of deposition, a cycling of the radiant heating source on and off is begun. For example, the heating source is switched on for 1.5 seconds and off for 1.5 seconds. During the off cycle, heat is conducted within the wafer from local hot spots to cool spots and the temperature distribution is made more uniform, thereby making the deposition more uniform.

These and further constructional and operational characteristics of the invention will be more evident from the detailed description given hereinafter with reference to the figures of the accompanying drawings which illustrate one preferred embodiment and alternatives by way of non-limiting examples.

GLOSSARY

The following is a glossary of terms, elements, and structural members as referenced and employed in the present invention.

10—CVD apparatus of the invention
12—frame
14—wafer loading apparatus
16—deposition chamber
18—gas mixing chamber
20—first injection ring
22—second injection ring
24—baffle
26—stuffing gland
28—O-ring
30—shaft
32, 34, 36, 38—exhaust pipes
40—pumping manifold
42—gas duct
44—injection port
46—wafer
48—outer shell
50—inner shell
52—openings
54—central chamber
56—adjustable shutters 58—semicircular openings
60—pipe
61—cassette
62—cassette chamber
64—loadlock
66—cassette elevator
68—manipulator arm
69—motor
70—blade
72—lifting arms
74—finger
76—chuck
78—chuck face
80—chuck walls
824—chuck back ring
84—chuck water cooling channel
86—quartz back plate
92—small holes
94—radial grooves
96—circumferential groove
98—array of lamps
100—feed line
102—dark space shield
110—central controller
112—pumping system for reaction chamber
114, 116—valves
120—RF power source
122—gas flow controls
124—pumping system for wafer loader
126, 127, 128—valves
130—first arm
132—second are
134—third are
136, 138, 142, 144, 148, 150—pulleys
140, 146, 152—belts
210—reaction chamber
212—cooling channel
214—gas mix chamber
216—ring insulator
218, 220—gas injector rings
222—chuck holder
224—interior surface of water cooled chuck
226—quartz window
228—radiant energy source
230—ring chuck
232—wafer
234—wafer clamp assembly
236—insulating ring
238—exhaust port
240—gas duct
242—gas deflector
244—shaft
246—gland
248—pyrometer
250—plate
252—water cooling channels
254—lamps
256—sockets
258—truncated cone
260—bar
262—parabolic reflectors

DESCRIPTION OF THE PREFERRED EMBODIMENTS

Figure 1:
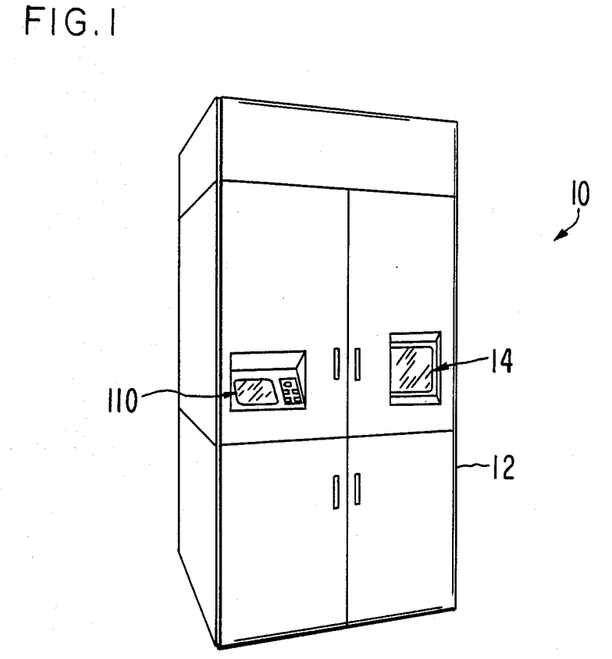
FIG. 1 shows an overall view from the front of the chemical vapor deposition apparatus according to the invention.
Figure 2:
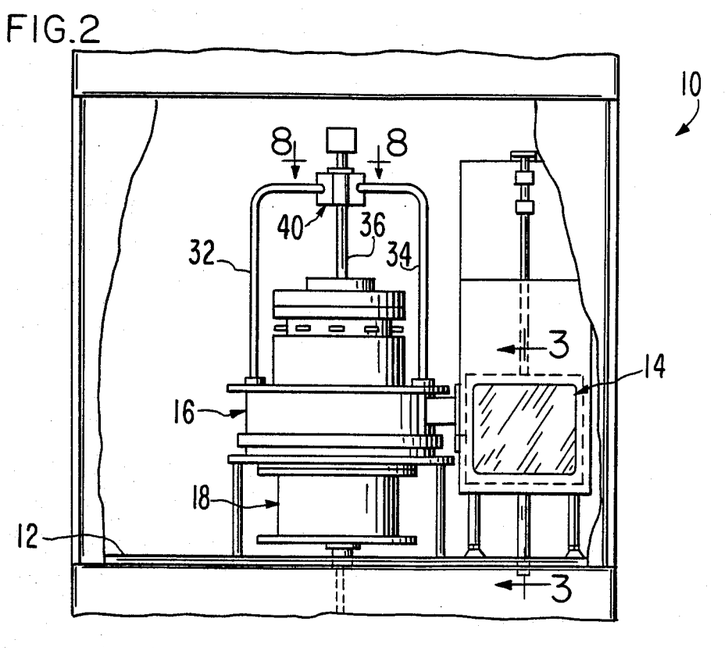
FIG. 2 is a partial sectional view of the apparatus of FIG. 1.
Figure 3:
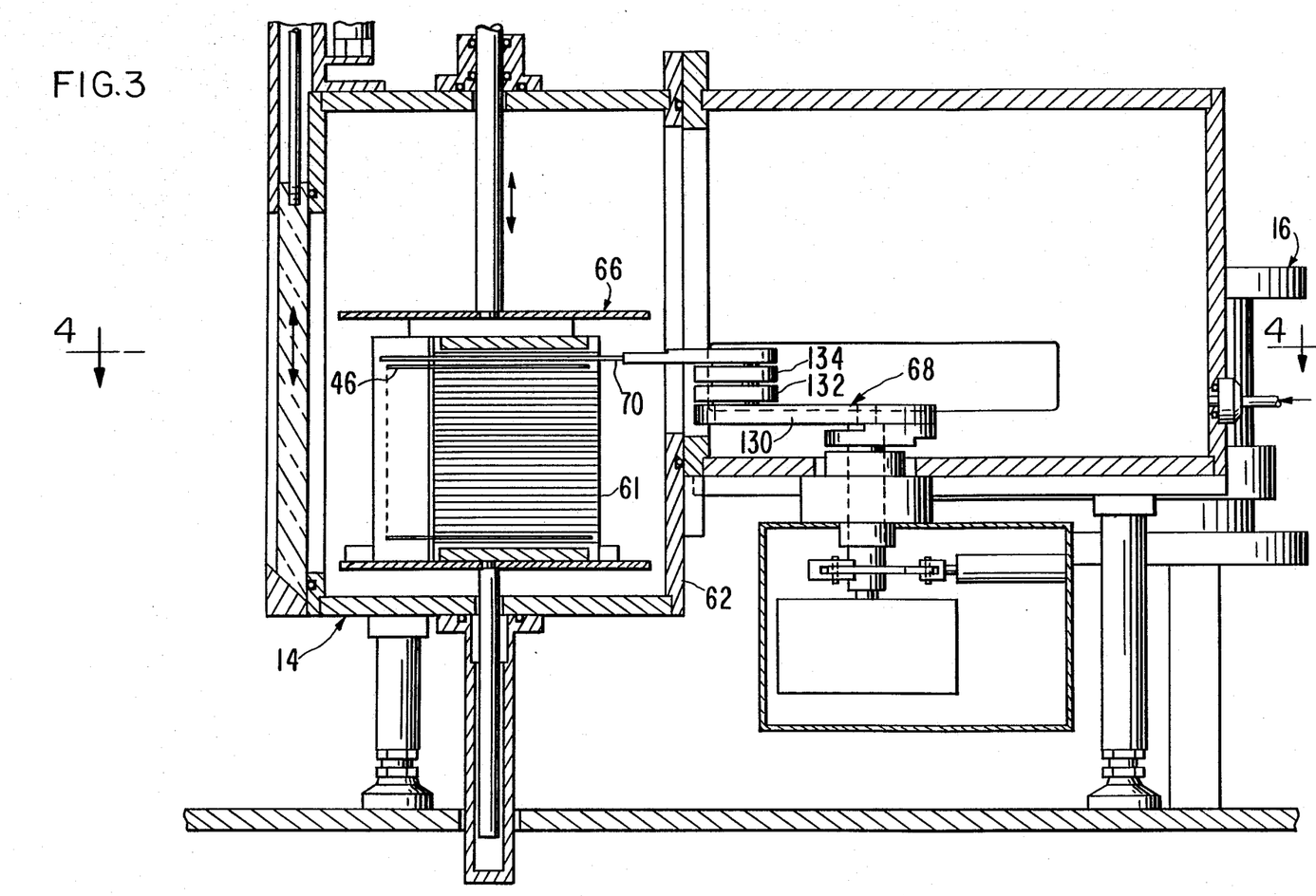
FIG. 3 is a sectional view along the section 3—3 of FIG. 2.

Referring now to the drawings wherein reference are used to designate parts throughout the various figures thereof, there is shown in FIGS. 1 and 2 a general view of the chemical vapor deposition apparatus 10 according to the invention. A frame 12 supports a wafer loading apparatus 14, deposition chamber 16, gas mixing chamber 18, and exhaust manifold 46.

Figure 5:
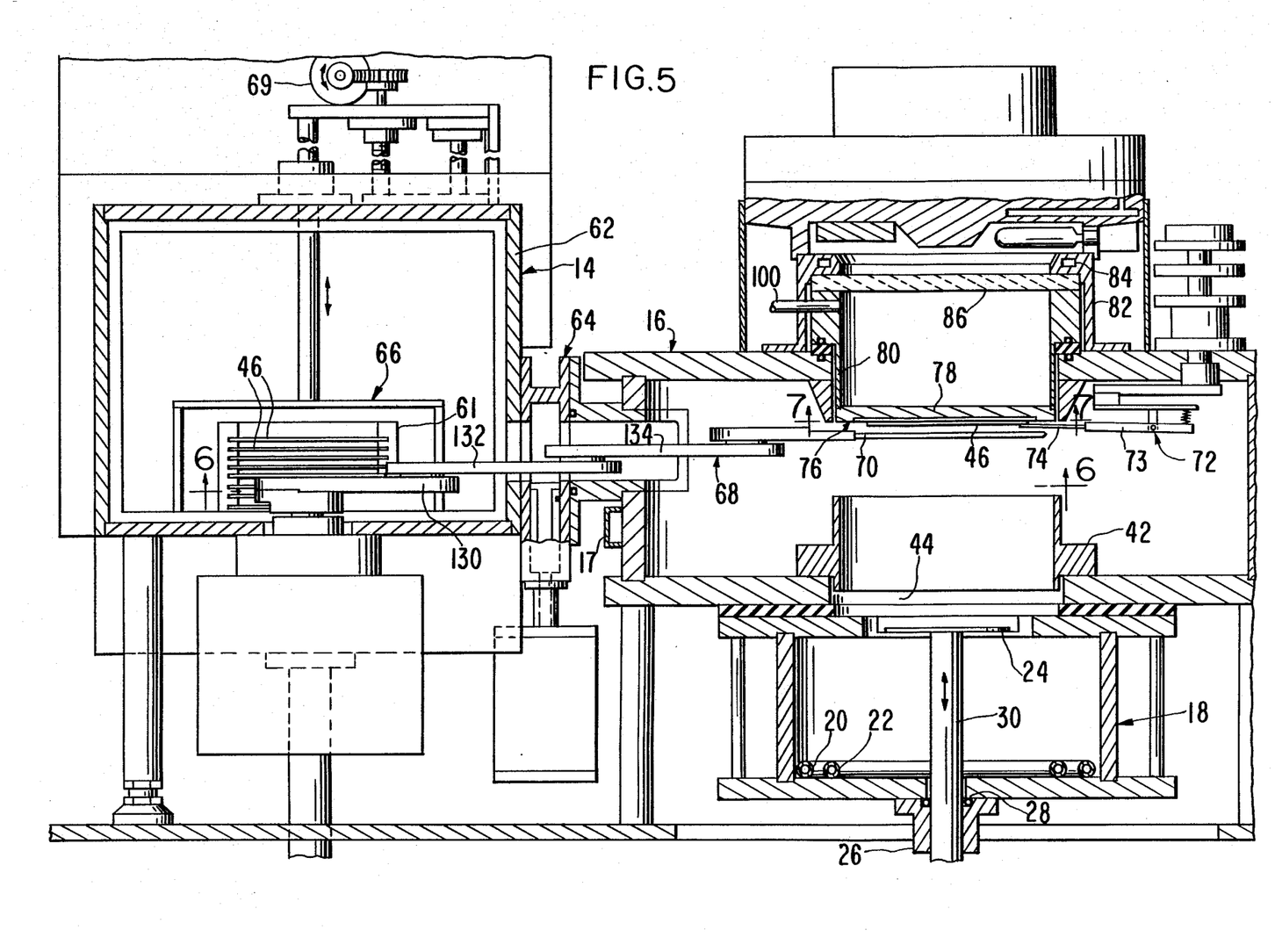
FIG. 5 is a sectional view along the lines 5—5 of FIG. 4.

In a chemical vapor deposition apparatus of the cold-wall type, one mode of operation is to inject two different reactive gases which must be completely mixed before these gases impinge on the heated workpiece. A gas-mixing chamber 18 separate from the deposition chamber is used to control the mixing before deposition. Two gases are injected into the mixing chamber 18, as shown in FIG. 5, through pipes in the form of first ring 20 and second ring 22. These rings can be concentric in the same plane, or they can be of the same size positioned one above the other; in either embodiment they must be close to facilitate good mixing. Each injection ring 20, 22 is hollow to facilitate flow of gas throughout the ring and has multiple small outlet holes for injection of the gas from each ring into the mixing chamber 18. The size of the tube of each ring is large compared to the hole diameter to ensure a minimum pressure drop down the tube and therefore uniform gas flow through each hole. A mixing baffle 24 slidable through a stuffing gland 26 with O-ring 28 in a vertical direction for adjustment of optimum gas flow uniformly over the wafer surface resulting in uniform deposition. The mixing baffle 24 has a disk shape and is mounted on the end of shaft 30. The deposition chamber 16 has a water cooling channel 17 in the outer walls to reduce reactions at the walls and water cooling channels in the top and bottom plates (not shown). The mixing chamber 18 also has water cooling channels (not shown).

To facilitate uniformity of deposition coverage of the workpiece, the deposition chamber 16 is pumped through three or more outlets with exhaust pipes 32, 34, 36, 38 into a pumping manifold 40. In a particularly preferred embodiment four, outlets are used to facilitate balanced adjustment of pumping.

In a reaction chamber having a semiconductor wafer facing downward near the center of the chamber and having process gas directed upward from an injection port, the exhaust ports could in concept be above and around the wafer as in the invention, or to the sides of the chamber or around and below the injection port. The configurations with exhaust ports to the side or below the wafer have been found to produce poor gas flow. Such configurations either remove the process gas before it impinges the wafer, or fail to remove reacted gases fast enough and thus to mix incoming gas with reacted gas, or produce uneven coatings. Mixing incoming gas with reacted gas can sometimes cause problems such as impurities trapped in the deposited film or may cause unwanted reactions such as losing selectivity in the selective tungsten process.

The advantages of good flow with the exhaust ports around and above the wafer can be further enhanced by use of a gas duct 42 between the injection port and the wafer. The duct is approximately the diameter of the workpiece and extends from the injection port 44 to within about an inch of the wafer 46 being processed.

In concept the gas duct 42 could be eliminated by making the reaction chamber smaller and thus reducing the space between the injection port 44 and the wafer 46. In practice, however, the reaction chamber must be large enough to allow placement of exhaust ports around the wafer and to allow room for a wafer holding mechanism. Thus, the need for room for other considerations creates the need for a gas duct 42. The gas duct 42 provides further advantage in combination with an adjustable baffle 24. The gas duct 42 acts as an extension of the injection port enhancing the effectiveness of the adjustable baffle 24. The combination of the adjustable baffle and gas duct have been shown to increase the uniformity of deposition and the deposition rate.

Figure 12:
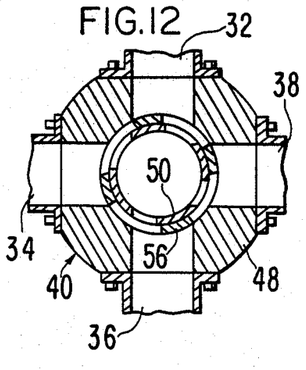
FIG. 12 is a sectional view of the alternate embodiment using four exhaust ports.

The manifold 40, as shown in FIGS. 8–12, has an outer shell 48 attached to the pipes 32, 34, 36, and cylindrical inner shell 50 with three or more openings 52 into a central chamber 54. Three or more independently adjustable shutters 56 each with semicircular opening 58 are used to adjust the pumping from each of three or more outlets. Each of the three shutters 56 are slidable between the outer shell 48 and inner shell 50 and lockable by means of a set screw (not shown). The central chamber 54 is connected to a pumping system (not shown) through pipe 60. The manifold 40 can be used with four pipes as shown in FIG. 12 with four independently adjustable shutters to facilitate adjustment in orthogonal directions.

Figure 7:
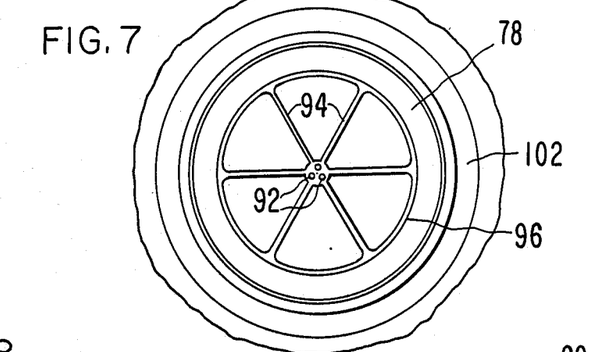
FIG. 7 is a view of the face of the chuck along the section line 7—7 of FIG. 5.
Figure 8:
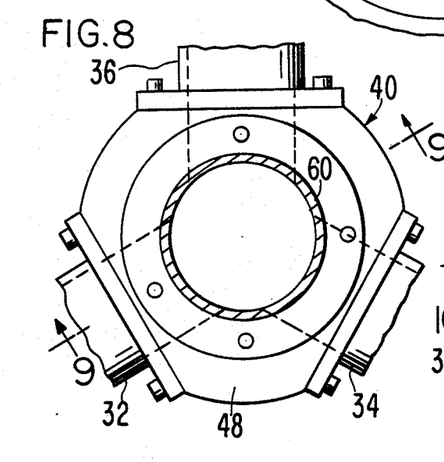
FIG. 8 is a view of the exhaust manifold along the section line 8—8 of FIG. 2.
Figure 9:
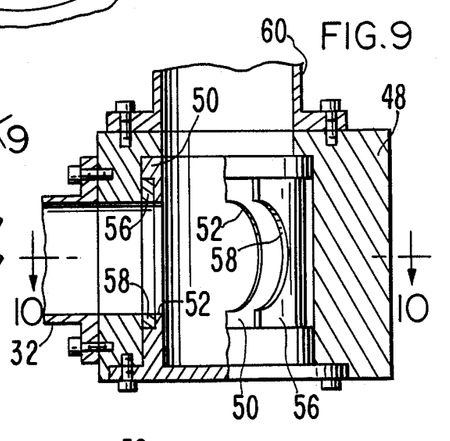
FIG. 9 is a view of the exhaust manifold along the section line 9—9 of FIG. 8.
Figure 10:
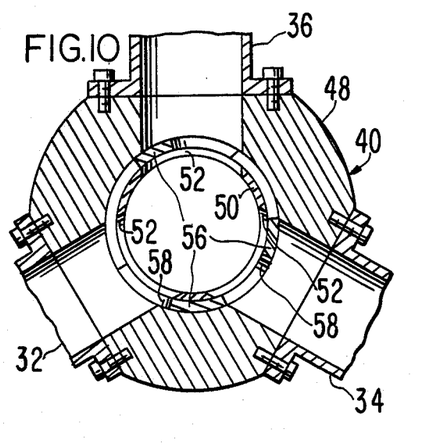
FIG. 10 is a view of the exhaust manifold along the section line 10—10 of FIG. 9
Figure 11:
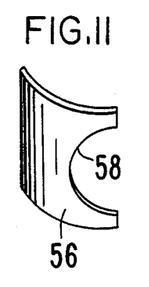
FIG. 11 is a view of the shutter shown in FIGS. 9 and 10.

The deposition chamber 16 is separated from the cassette chamber 62 by a loadlock 64. In operation a cassette 61 of wafers is inserted in the cassette chamber 62, the cassette chamber 62 is sealed and then pumped. The cassette 61 is positioned by a cassette elevator 66. A manipulator arm 68 slides a blade 70 under a wafer 46, and the blade 70 with wafer is withdrawn from the cassette 61. The manipulator arm 68 is rotated by a motor through a 90° angle. The loadlock 64 is opened and the manipulator arm 68 extends carrying the blade 70 with wafer 46 into the center of the deposition chamber 16. Three lifting arms 72 each having a ceramic finger 74 approximately one-eighth inch in diameter attached to support 71, lift the wafer 46 off the blade and contact the back side of the wafer 46, face down, with the chuck 76. A larger number of ceramic fingers can be used to avoid the necessity of prealigning the wafer to orient the flat, however, typically 3 fingers are used with prealignment of the wafers in the cassette. The chuck 76 is a hollow assembly having a face 78, walls 80 of stainless steel, metal back ring 82 with water cooling channel 84 and a quartz back plate 86. The chuck 76 extends into the deposition chamber 16 away from the top of the chamber 16 to facilitate uniform flow of gases over the wafer. The chuck 76 is filled with helium, or other inert gas such as argon, at 3–6 Torr. The helium bleeds through three small holes 92 near the center of the metal face 78 as shown in FIG. 7. An optional pattern of six radial grooves 94 and a circumferential groove 96 of about ninety thousandths inch radius can be used to conduct heated gas across the back of the wafer to provide thermal contact. The chuck 76 is heated through the quartz back plate 86 by an array 98 of six or more air- or water-cooled 1000 W tungsten-halogen lamps which can be powered through a heat controller to regulate the heat generated to heat the chuck.

The lamps are directed along the interior edge of the chuck to provide uniform heating. Sensors on the chuck 76 detect the temperature. The sensed temperature is sent to a controller 110 which controls the lamps to control the temperature. The heat at the wafer can be controlled to within a few degrees from 150° C. to CVD temperatures.

The chuck 76 can be operated in a heat-enhanced mode, or plasma-enhanced mode or a combination of both. The chuck 76 is insulated from ground by the ceramic and can thus support an RF potential fed by a cable means (not shown). A power level of about 100 W is sufficient for enhancing depositions on the face of the wafer. The feed line 100 for gas into the chuck 76 must be made of insulating material. A small piece of screening material such as cloth gauze inserted in the feed line 100 prevents the plasma from extending up the feed line 100. Dark space shields 102 are used at the side of the chuck 76 to prevent extraneous plasma along the side walls of the chuck 76. Dark space shields 73 are also used on the ceramic fingers 74 to prevent plating which would short the insulating properties of the ceramic.

The plasma can be used to clean the deposition chamber 16, thus minimizing downtime for cleaning. With the wafer removed the RF power is increased from the deposition level of about 100 W to above 400 W. An etch gas of $NF_3$ or $CF_4$ and $O_2$ may be introduced at about 200 millitorr for cleaning. At this power level the plasma extends to and cleans the entire deposition chamber 16.

The walls of the deposition chamber 16 are water-cooled both to prevent gas phase reactions and to prevent deposition on the chamber walls which can result in particulate contamination. The chamber walls can be made of aluminum or stainless steel. Aluminum is an excellent chamber material for use in the deposition of oxide, nitride, polysilicon, refractory metals and refractory metal silicides. Stainless steel is more suitable for other materials requiring chlorine processes.

In most processes there is a maximum temperature above which deposition takes place. There is also a minimum temperature below which one of the process gases will condense on the walls of the apparatus. Thus the temperature of the reaction chamber and the mixing chamber must be regulated to be between the deposition temperature and the condensation temperature. The cooling water system must thus have means for either heating or cooling the water as conditions demand to stay within these bounds.

Figure 13:
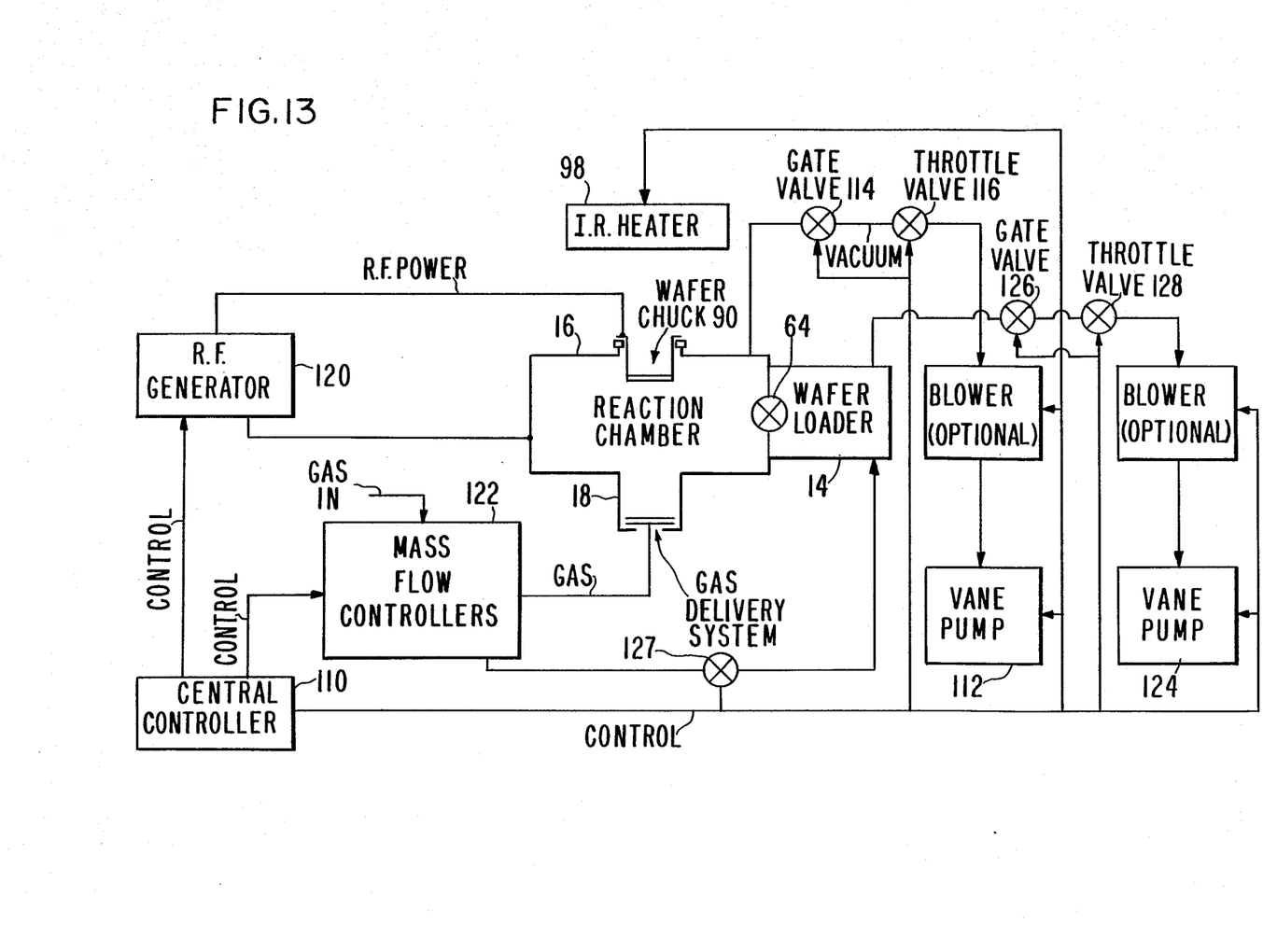
FIG. 13 is a block diagram of the gas flow system.

The entire system is controlled by a central controller 110, such as a digital computer, as shown in FIG. 13. The controller 110 controls the wafer loader 14, the pumping system 112 for the reaction chamber with various valves 114, 116, 126, 128 and the loadlock 64. When appropriate, the controller 110 turns on the heater lamps 98, the RF power source 120, and the mass flow controllers 122 to inject gas. The controller 110 also controls a separate pumping system 124 for the wafer loader 14.

It is desirable to maintain a gas flow from the wafer loader 14 toward the reaction chamber 16 to prevent traces of toxic process gases from leaking into wafer loader 14 when the valve 64 is opened and then into the room when the door of the wafer loader is opened to remove the finished cassette. To this end a valve 127 is used to bleed dry nitrogen or other inert gas into wafer loader 14 just before and during opening the valve 64.

Figure 4:
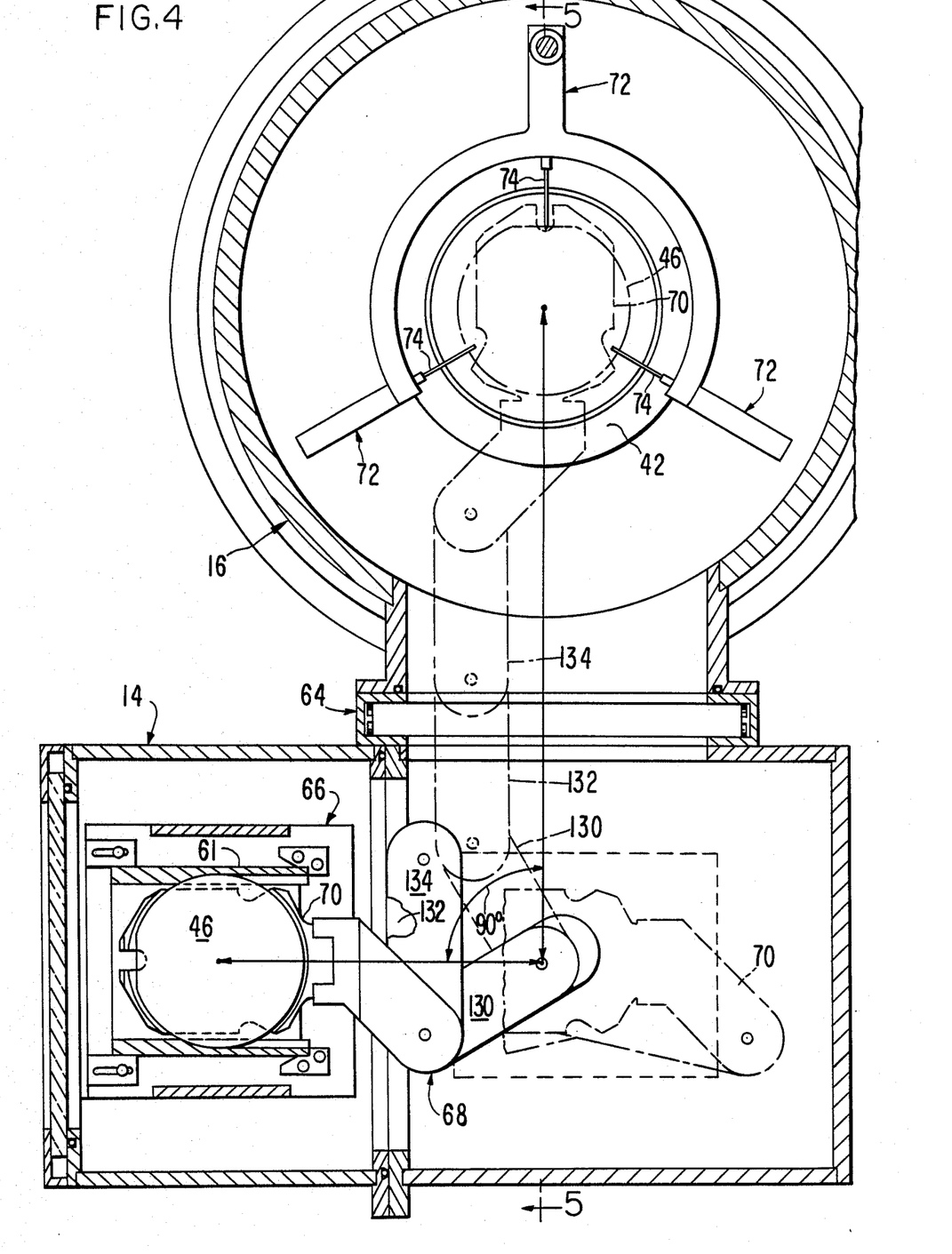
FIG. 4 is a sectional view along the section 4—4 of FIG. 3.
Figures 6, 6A, 6B, 6C:
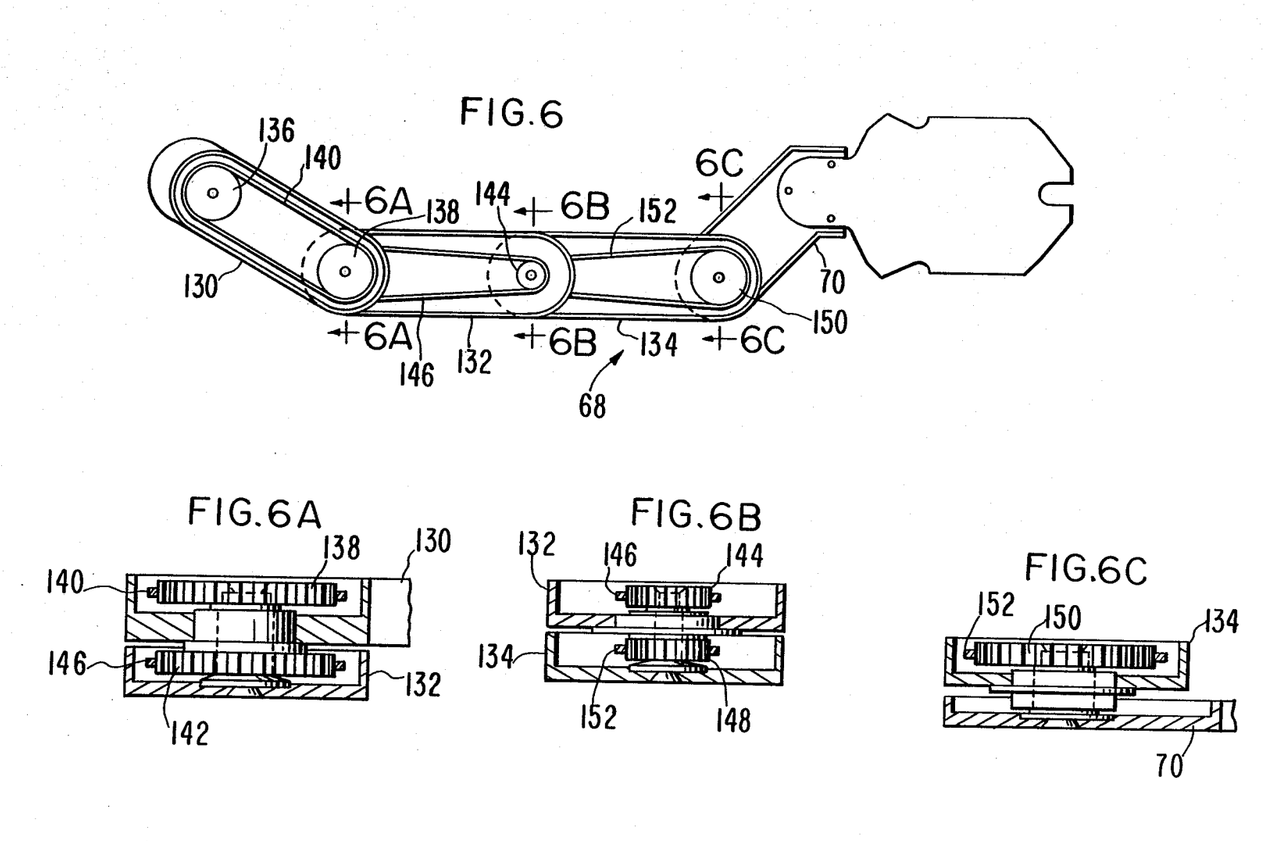
FIG. 6 is a bottom view of the wafer handling arm of the invention along the section line 6—6 of FIG. 5.
FIGS. 6A, 6B, and 6C are sectional views of the arm along the lines 6A—6A, 6B—6B and 6C—6C of FIG. 6.

The manipulator arm 68 is shown in FIG. 4 removing a wafer 46 from a cassette 61 in solid lines and in phantom placing the wafer 46 in the reaction chamber 16. The manipulator arm 68 is formed of four principal pieces: a first arm 130, a second arm 132, a third arm 134 and the blade 70 pivotally connected to each other in this order. These pieces are coupled with belts and pulleys as shown in FIG. 6. A first end of first arm 130 is connected to concentric drive shafts and to motors so that first arm 130 can be rotated about the first end or pulley 136 can be rotated, each motion being independently controlled. Pulley 136 drives pulley 138 at the second end of first arm 130 with belt 140. The second end to a first end of second arm 132 and pulley 138 is coupled directly to pulley 142. Pulley 142 is coupled to pulley 144 with belt 146. Pulley 142 has a ratio of circumferences to pulley 144 of two-to-one. The second end of second arm 132 is coupled to a first end of third arm 134. Pulley 144 is directly coupled on a common shaft to pulley 148 on third arm 134. Pulley 150 at a second end of third arm 134 is driven by belt 152 from pulley 148. Pulley 144 has a ratio of circumferences to pulley 150 of one-to-two.

Figure 14:
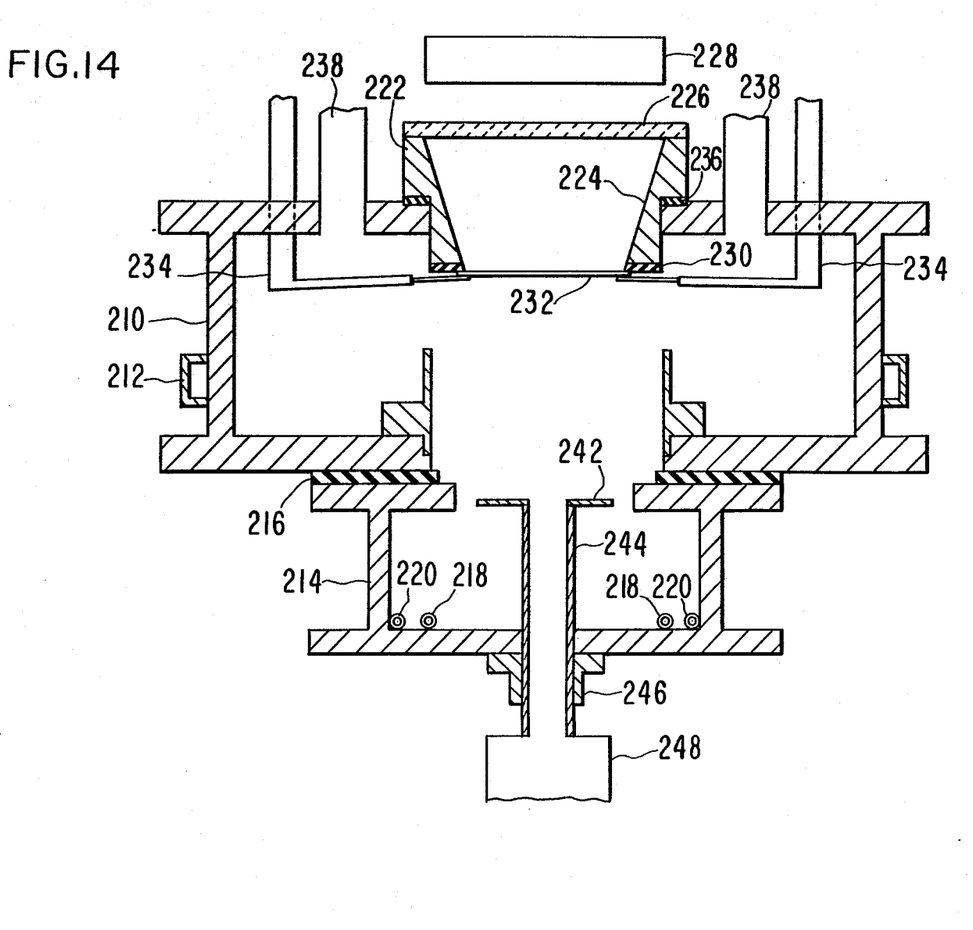
FIG. 14 is a sectional view through the apparatus according to the invention.

Improved performance can be achieved with the use of a rapid thermal chuck shown in FIG. 14. A vacuum-tight reaction chamber 210 formed of metal or similar material is fitted with a cooling channel 212 and other cooling channels (not shown). A gas mix chamber 214 is attached below the reaction chamber 210. Gas mix chamber 14 is equipped with suitable cooling channels (not shown). Gas injector rings 216, 218 are connected through suitable feedthroughs in the bottom plate of the gas mix chamber 214 to sources of process gas external to the apparatus. A ring insulator 216 is used between the reaction chamber 210 and the mix chamber 214 to facilitate independent temperature control. A water cooled chuck holder 222 is located at the top of the reaction chamber. The interior faces 224 of the chuck holder 222 can be polished and sloped as shown or vertical with a step at the bottom. The upper surface of the chuck holder 222 is sealed to a quartz window 226 to provide a vacuum wall which passes radiant energy. The size of the quartz window is determined by the size of the radiant energy source 228; the larger the energy source the larger the quartz window 226 must be, allowing larger wafers to be coated. At the bottom of the chuck holder 222 there is a ring chuck 230 of quartz or other suitable material the interior diameter of which is slightly smaller than the wafer to be processed. The wafer 232 is held face down to the ring 230 with a wafer clamp assembly 234. An insulating ring 236 is provided to electrically insulate the chuck 222 from the reaction chamber 210. The top of the reaction chamber 210 is fitted with a plurality of exhaust ports 238. The gas mix chamber 214 is connected to the reaction chamber 210 so as to direct a flow of mixed reaction gases at the wafer 232. A gas duct 240 is used to guide the flow of gases to the wafer. A gas deflector 242 is centered in the opening between the reaction chamber 210 and mix chamber 214. The gas deflector 242 is mounted on a shaft 244 which passes through a gland 246 facilitating a slidable seal so that the gas deflector 242 may be adjusted in vertical position within the opening to deflect the gas to get a uniform deposition on the substrate. Shaft 246 is made hollow and there is a hole in the center of gas deflector 242 so that pyrometer 248 can be sealed to shaft 244 outside the vacuum. Pyrometer 248 is aimed at the wafer 232 to measure its temperature and provide feedback for temperature control.

Figure 15:
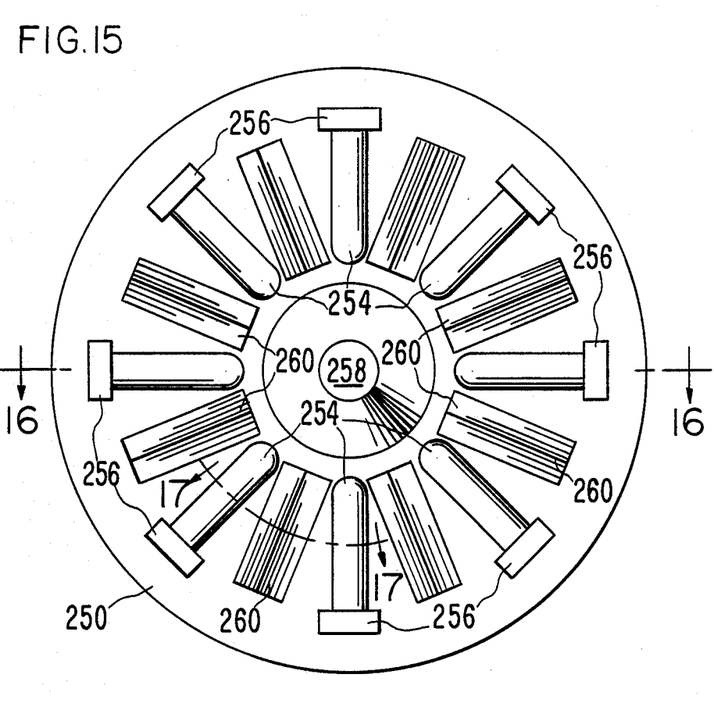
FIG. 15 is a view from below of the radiant energy source according to the invention.
Figure 16:
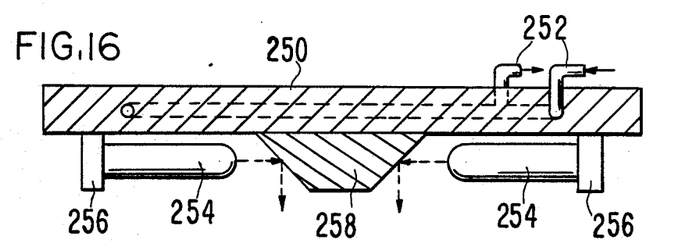
FIG. 16 is a section of the radiant energy source of FIG. 15 along the line 16—16.
Figure 17:
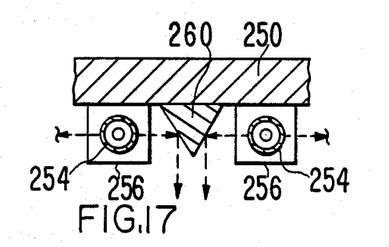
FIG. 17 is a section of the radiant energy source of FIG. 15 along the line 17—17.
Figure 18:
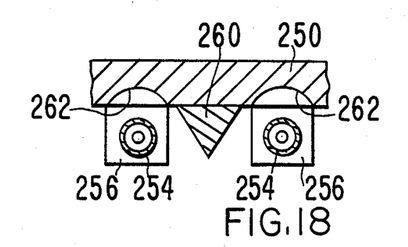
FIG. 18 is a section of the radiant energy source in an alternate embodiment.

In FIG. 15 there is shown a view from below of the radiant energy source according to the invention. A plate 250 is fitted with water cooling channels 252 to provide a heat sink. Eight to sixteen tungsten halogen lamps 254 are arranged in a radial pattern from the center of the plate 250. Suitable lamps are OSHIO Model FEP providing 1000 to 2000 watts each. Sockets 256 for the lamps 254 are securely mounted to the cooled plate 250. At the center of the plate 250, a truncated cone 258 may be used to provide a radiation reflector. Between each pair of lamps, a bar 260 with triangular cross-section is used to shield each lamp from its neighbors and to reflect the radiation downward. The bottom of the plate 250, the cone 258 and the bars 260 are each highly polished and plated with gold or nickel to provide a high reflectivity. In an alternate embodiment shown in FIG. 18 cylindrical parabolic reflectors 262 are formed in the plate 250 to improve the concentration of the radiant energy on the wafer.

The novel selective tungsten process according to the invention is best conducted in the rapid thermal chuck apparatus described heretofore. In this process, the wafer workpiece is secured to the ring chuck 230 and the deposition chamber 16 is pumped to a base pressure of less than 10 mTorr. The process gases $H_2$, Ar, and $WF_6$ are introduced into the gas mixing chamber 18 and mixed therein at an appropriate flow rate ratio of 100:2:1, respectively. For example, the flow rate of hydrogen might be 500 sccm, the flow rate of argon might be 10 sccm and the flow rate of tungsten hexafluoride might be 5 sccm. The pressure of the process gases in the deposition chamber 16, however, is best maintained at about 200 mTorr during the deposition. The radiant heater is switched on and the temperature of the wafer is ramped from less than 30° C. (ambient) to about 600° C. in about a minute for a silicon substrate. (For deposition on aluminum, the final temperature can be less than 430° C.) As the temperature approaches the upper temperature, the radiant heater is switched on and off at a rapid rate, 1 to 1.5 seconds on and 1 to 1.5 seconds off, for example. In this manner, the average temperature of a silicon substrate is held oscillating between about 550° C. and 650° C., and the spatial uniformity of temperature across the wafer is made more even.

It is essential that the selective tungsten process be practiced while using a chuck of dielectric material such as quartz, oxides or nitrides. If a metal chuck is used, the selectivity is seriously degraded.

The ramping of the temperature can also be practiced stepwise. For example, the temperature can be raised to 300° C. and held at this temperature for a period and then raised again. It has been found, however, that a stepwise raising of the temperature does not achieve better results than continuous ramping and does take longer.

This process results in a deposition rate of 1000–2000 Å/min with a typical deposition rate of 1500 Å/min at approximately 550° C. and 1 micron films with excellent selectivity and minimum encroachment on the silicon substrate. The pulsing of the heating results in improved uniformity of deposition. Uniformities of ±7% across the wafer have been achieved.

It is to be understood that the temperatures and flow rates described are for the best mode of rapid production rate with good uniformity. Low temperatures and pressures will result in lower production rates and higher temperatures and flow rates will degrade the uniformity of the deposition. However, a wide range of flow rates and pressures will achieve acceptable results. The flow rates and pressures can be varied within a factor of two or more at acceptable costs. The temperature of the wafer as a function of time is more critical. At temperatures of 300°–400° C., the deposition rate is 25 to 50 Å/min. This results in good quality deposition with minimum encroachment, but takes an excessive time to achieve a workable thickness of tungsten. There is essentially no deposition below 300° C. It is desirable to conduct the deposition in as short a time as possible because longer times make the wafer more susceptible to non-selectivity. Thus, ramping the temperature through the low deposition rate temperature range in a few seconds achieves an initial coating at low temperature with minimum encroachment and continuing to raise the temperature while depositing achieves an optimum deposition rate. The temperature should be raised to the upper temperature limit in more than 20 seconds, but no more than a few minutes. The pulse rate of 1.5 seconds on and 1.5 seconds off can be varied between about 0.5 and 3.0 seconds, respectively, at the cost of reducing the uniformity or production rate.

This invention is not limited to the preferred embodiments and alternatives heretofore described, to which variations and improvements may be made including mechanically and electrically equivalent modifications, changes and adaptions to component parts, without departing from the scope of production of the present patent and true spirit of the invention, the characteristics of which are summarized in the appended claims.

What is claimed is:

1. An apparatus for quickly heating a semiconductor wafer in a wafer processing machine, comprising:
   a ring chuck and clamping means for holding a wafer face downward;
   a holder for holding said ring chuck;
   a window located above and spaced from the wafer;
   a radiant heat source located above the window;
   said window being sealed to said holder to provide a vacuum-tight seal, and said holder being sealed to the processing machine to provide a vacuum-tight seal.

2. The apparatus of claim 1 wherein said ring chuck and said window are formed of quartz.

3. The apparatus of claim 1 further including means for introducing a gas into said holder.

4. The apparatus of claim 3 wherein said window is on the top of said holder, said ring chuck is on the bottom of said holder, and the wafer is clamped to the ring chuck face down.

5. The apparatus of claim 4 further including a means for electrically insulating said holder from the processing machine.

6. The apparatus of claim 5 wherein said radiant heat source includes a multiplicity of tungsten halogen lamps arranged in a radial pattern.

7. The apparatus of claim 6 wherein said radiant heat source includes a truncated cone reflector at the center of said source.

8. The apparatus of claim 7 wherein said radiant heat source includes bars of metal having a triangular cross-section between said tungsten halogen lamps whereby to reflect light downward.

9. The apparatus of claim 8 further including a water-cooled reflective plate and wherein said bars, cone and lamps are mounted to said water-cooled reflective plate.

10. The apparatus of claim 9 wherein said bars, cone and plate are highly polished and plated with highly reflective material.

11. The apparatus of claim 4 further including a pyrometer means for measuring the temperature of the wafer mounted below the wafer.

12. The apparatus of claim 6 further including a parabolic reflector formed in a plate behind each lamp.

13. The apparatus of claim 11 wherein said pyrometer means is mounted in an adjustable gas flow deflector below said wafer.

14. The apparatus of claim 4 further including a pyrometer means for measuring the temperature of the wafer mounted above the wafer.

15. The apparatus of claim 6 further including a pyrometer means for measuring the temperature of the wafer mounted in the center of said multiplicity of tungsten halogen lamps.

16. An apparatus for quickly heating a semiconductor wafer in a wafer processing machine, comprising:
   a ring chuck for mounting a wafer facing downward;
   a holder for holding said ring chuck;
   a window above and spaced from the wafer, said window being sealed to said holder to provide a vacuum-tight seal, said holder being sealed to the processing machine to provide a vacuum-tight seal;
   a means for introducing a gas into said holder between said window and the back of the wafer; and
   a radiant heat source located above said window.

17. The apparatus of claim 16 wherein said radiant heat source includes a multiplicity of cylindrical lamps arranged in a radial pattern.

18. An apparatus for quickly heating a semiconductor wafer in a wafer processing machine, comprising:
   a ring chuck on which a wafer can be mounted;
   a holder for holding said ring chuck in said processing machine;
   a window spaced from the rear surface of a wafer in position on said chuck;
   a radiant heat source positioned in respect to said window to direct radiant energy through said window to a wafer in position on said chuck, said radiant heat source including a multiplicity of cylindrical lamps arranged in a radial pattern;
   said window being sealed to said holder to provide a vacuum-tight seal, and said holder being sealed to the processing machine to provide a vacuum-tight seal.

19. The apparatus of claim 18 further including a reaction chamber and wherein said radiant heat source is positioned outside said chamber and said ring chuck is positioned within said chamber.

20. An improvement in apparatus for holding and heating a workpiece semiconductor wafer in a low pressure chemical vapor deposition cold wall reactor, the reactor including a reaction chamber, means for feeding reactant gases into said chamber and means for exhausting reaction by-product gases from the reaction chamber, the improvement comprising:
   lamp means for heating a wafer;
   mounting means for mounting said lamp means external to the reaction chamber;
   positioning means for positioning a chuck means within the reaction chamber;
   chuck means for holding a workpiece semiconductor wafer, said chuck means being positioned in said positioning means;
   radiation transmitting means for passing radiation from said lamp means, said radiation transmitting means being spaced from said chuck means, said radiation transmitting means being positioned between said lamp means and said chuck means;
   said positioning means, said chuck means and said radiation transmitting means being sealed to each other to form an enclosure together with a workpiece semiconductor wafer when the wafer is mounted on said chuck means; and
   means for introducing an inert gas into said enclosure.

21. The apparatus of claim 20 wherein said lamp means is a plurality of lamps arranged in a radial pattern, said lamp being mounted in a reflector.

22. The apparatus of claim 20 wherein said chuck means is a means for holding the workpiece semiconductor wafer in a generally horizontal plane with the face of the wafer on which deposition is to occur in a downwardly facing direction.

23. Apparatus for rapid thermal treatment of wafers in a chemical vapor deposition cold wall reactor, comprising:

a reaction chamber;

means for feeding reactant gases into said reaction chamber;

means for exhausting reaction by-product gases from said chamber;

positioning means within said chamber for a chuck to hold a wafer during processing;

a chuck adapted to be positioned in said positioning means, said chuck when in said positioning means being adapted to maintain a wafer in a generally horizontal plane with the face on which deposition is to occur in a downwardly facing direction, said chuck when in said positioning means having associated therewith cooling means to flow a cooling liquid into and out of thermal contact with said chuck;

a radiation transmitting means spaced from and associated with a wafer when positioned in said chuck;

an enclosure for a gas further comprising said radiation transmitting means and a rear surface of a wafer in said chuck within the chamber;

lamp means positioned to direct radiant energy at the rear surface of a wafer in position in said chuck; and means to feed an inert gas into said enclosure.

24. The apparatus of claim 23 wherein said radiation transmitting means is sealed into a top surface of said reaction chamber to form a gas-tight barrier.

25. The apparatus of claim 24 wherein said lamp means is a plurality of lamps arranged in a radial pattern.

* * * * *